United States Patent [19]

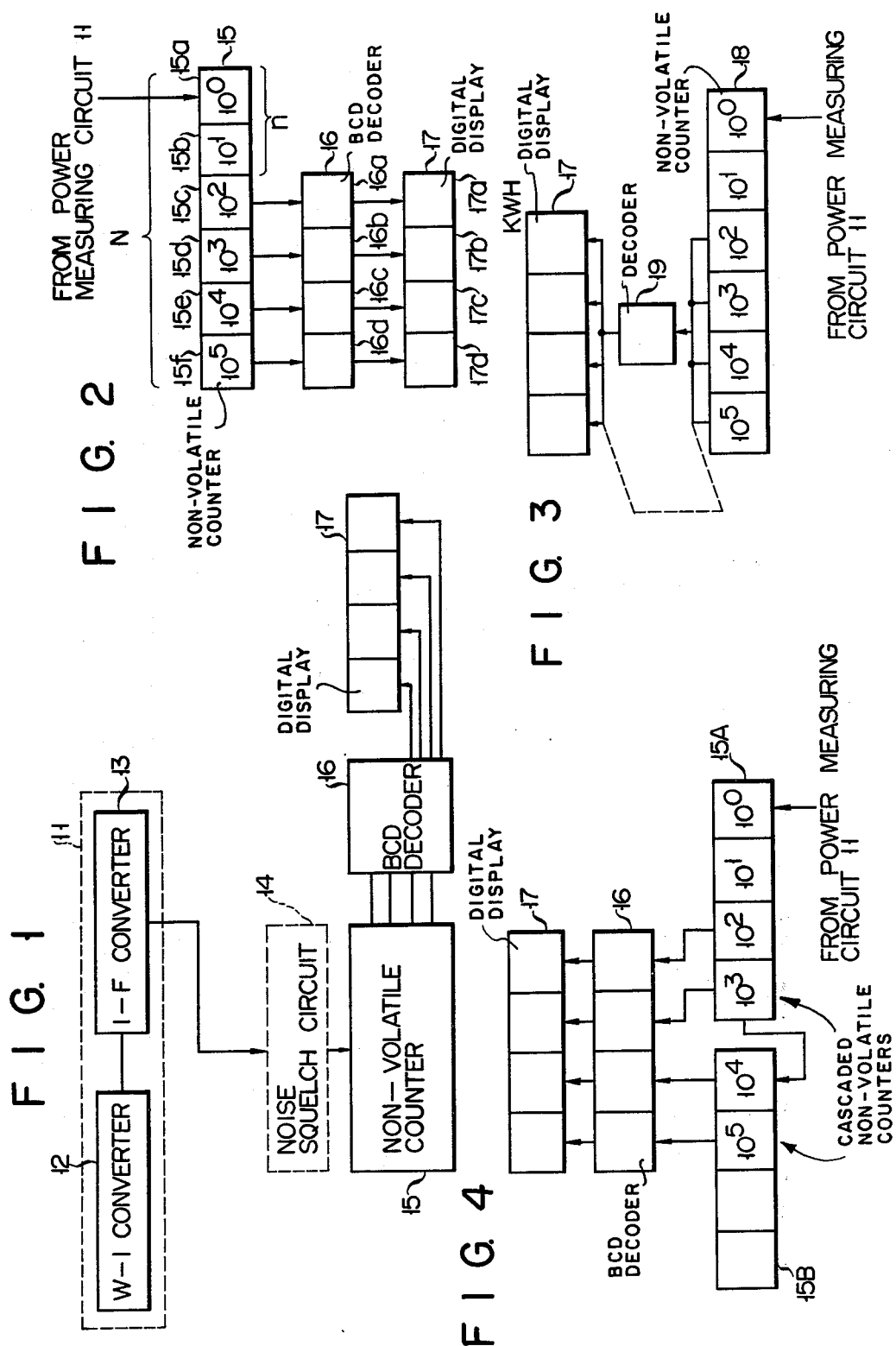

Takahashi

[11] 4,165,485
[45] Aug. 21, 1979

[54] ELECTRONIC WATT-HOUR METER
[75] Inventor: Haruo Takahashi, Kawasaki, Japan
[73] Assignee: Tokyo Shibaura Electric Co., Ltd., Kawasaki, Japan
[21] Appl. No.: 829,573
[22] Filed: Aug. 31, 1977
[30] Foreign Application Priority Data Sep. 9, 1976 [JP] Japan ............................ 51/107232

[51] Int. Cl.² .......................................... G01R 21/06
[52] U.S. Cl. ................................................. 324/142
[58] Field of Search ................ 324/142; 364/483; 235/92 MT; 307/220 R

[56] References Cited
U.S. PATENT DOCUMENTS

| | | | |
|---|---|---|---|
| 3,718,860 | 2/1973 | Kwast et al. | 324/142 |
| 4,056,774 | 11/1977 | Shum | 324/142 |
| 4,080,568 | 3/1978 | Funk | 324/142 |

FOREIGN PATENT DOCUMENTS

| | | | |
|---|---|---|---|
| 239439 | 1/1970 | U.S.S.R. | 324/142 |
| 432403 | 8/1975 | U.S.S.R. | 324/142 |

*Primary Examiner*—Stanley T. Krawczewicz
*Attorney, Agent, or Firm*—Cushman, Darby & Cushman

[57] ABSTRACT

An electronic watt-hour meter comprising an electronic power measuring circuit generating pulses at a rate proportional to the power to be measured and an N-digit decimal counter device formed of non-volatile semiconductor elements. The pulses from the power measuring circuit are supplied to the lowest digit position counter of the N-digit decimal counter device and the two lowest digit position counters act as a frequency divider. The outputs of the consecutive and higher digit position counters than the lowest digit position counters are applied to corresponding display sections of a display device, respectively.

4 Claims, 4 Drawing Figures

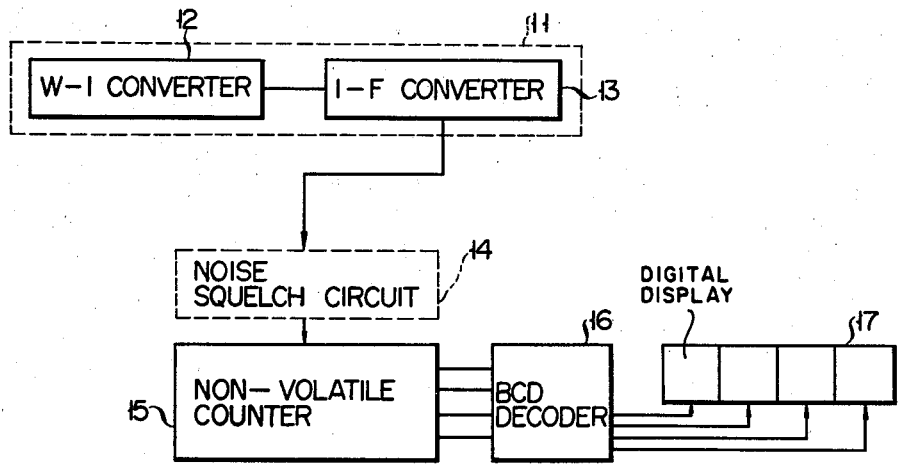

ELECTRONIC WATT-HOUR METER

This invention relates to an electronic watt-hour meter utilizing a counter device counting the pulses generated in proportion to the power to be measured.

Recently, an electronic watt-hour meter has come to be used practically in stead of an induction type watt-hour meter or Ferraris type watt-hour meter. One of electronic watt-hour meters is disclosed in "Metering, Apparatus and Tariffs for Electricity Supply Conference Publication," No. 92, September 1972, pages 329 to 334. The electronic watt-hour meter disclosed in this literature is provided with a power measuring circuit comprising two square-law circuits. Each square-law circuit comprises a plurality of diodes connected in series and exhibiting a nonlinear forward voltage-current characteristics resembling a graph of an exponential function. Further, branched resistors are connected to suitable junctions of these diodes, thereby allowing the voltage drops in the forward direction of these diodes to be subjected to adding calculation sequentially with the aid of the branched resistors.

One of the two square-law circuits of this construction is supplied with a voltage proportional to the sum of the voltage and current of the power being measured and the other circuit with a voltage proportional to the difference between the voltage and current of the power being measured. The current outputs of these square-law circuits are differentially connected to each other, thereby taking out the differential current proportional to the power being measured as the output of the power measuring circuit. The differential current mentioned is converted to pulses proportional to the differential current to be counted by a counter. The output of the counter is displayed on a display device, thereby rendering it possible to display the accumulation of the power.

In a watt-hour meter, it is absolutely necessary that the accumulated value be not erased even during power failures. To this end, a counter device counting the pulses generated in proportion to the power being measured is formed of elements capable of retaining the contents of the counter device even during power failure. A typical counter device meeting this requirement utilizes a mechanical counting system. In addition, it is considered to use an N-digit decimal counter device formed of non-volatile semiconductor elements like, for example, MNOS (Metal-Nitride-Oxide-Semiconductor) transistors.

However, a known watt-hour meter is constructed such that the frequency of the pulse signal from a power measuring circuit is divided by a frequency divider so as to increase the weight of the pulse and the output pulses of the frequency divider are supplied to the lowest digit counter of a counter device to count the pulses. A major difficulty inherent in the watt-hour meter of this type is that the pulses under frequency dividing operation within the frequency divider are lost during a power failure, rendering it impossible to measure accurately the power consumption.

An object of this invention is to provide an electronic watt-hour meter capable of accurately measuring the power and, during a power failure, free from loss of the accumulated value of the pulses from a power measuring circuit which are counted before the power failure and proportional to the power.

According to this invention there is provided an electronic watt-hour meter comprising an N-digit decimal counter device formed of non-volatile semiconductor elements, a power measuring circuit which generates pulses proportional to the power being measured and a display device, the pulses generated by the power measuring circuit being supplied to the lowest digit position counter of the decimal counter device, at least one lowest digit position counter of the decimal counter device acting as a frequency divider and the higher digit position counters of the decimal counter device higher than the lowest digit position counter being connected to the corresponding display sections of the display device to display the contents of the higher digit position counters.

This invention can be more fully understood from the following detailed description when taken in conjunction with the accompanying drawing, in which:

FIG. 1 is a block diagram of an electronic watt-hour meter according to one embodiment of this invention;

FIG. 2 is a block diagram showing the counter device, decoder and display device included in the electronic watthour meter of FIG. 1;

FIG. 3 is a block diagram showing a counter device, decoder and display device included in an electronic watthour meter according to another embodiment of this invention; and FIG. 4 is the block diagram of an electronic watt-hour meter using cascade-connected two counter devices, according to still another embodiment of this invention.

The electronic watt-hour meter described herein may be comprised entirely of conventional electronic components. Referring to FIG. 1, a power measuring circuit 11 comprises a W-I converter 12 and an I-F converter 13. As disclosed in "Metering, Apparatus and Tariffs for Electricity Supply Conference Publication," No. 92 September 1972, pages 329 to 334, the W-I converter 12 comprises two square-law circuits and full-wave rectifying circuits and serves to convert the power to be measured to a current proportional to the power. On the other hand, the I-F converter 13 serves to generate a pulse signal having the number of pulses proportional to the output current from the W-I converter 12. It follows that the number of pulses of the pulse signal generated by the I-F converter is proportional to the power to be measured.

The output of the power measuring circuit 11, i.e., the output of the I-F converter 13, is connected to a counter device 15 through a noise squelch circuit 14. The counter device 15 is provided by an N-digit decimal counter formed of non-volatile semiconductor elements. The output of the counter device 15 is connected to a display device 17 formed of, for example, light-emitting diodes through a BCD to 7-segment decoder 16.

The non-volatile counter device 15 constitutes a feature of the electronic watt-hour meter of this invention. As shown in FIG. 2, the counter device 15 comprises seriesconnected N-number, "6" in this embodiment, of decimal counters 15a, 15b, 15c, 15d, 15e and 15f corresponding to six consecutive digit positions, respectively, and acts as a 6-digit decimal counter. The pulses generated by the I-F converter 13 are supplied to the lowest digit position counter 15a of the 6-digit decimal counter through the noise squelch circuit 14. It is seen that the outputs of the higher digit position counters 15c, 15d, 15e and 15f are connected to corresponding decode circuits 16a, 16b, 16c and 16d of the BCD to 7-segment decoder 16, respectively. Further, the outputs of these decode circuits are connected to 7-segment display units 17a, 17b, 17c and 17d of the display device 17, respectively.

As described above, the contents of the digit position counters 15c, 15d, 15e and 15f of the counter device 15 for the digit positions of $10^2$ to $10^5$ are displayed through the BCD to 7-segment decoder 16 on the display device 17. On the other hand, the contents of the digit position counters 15a and 15b for the digit positions of $10^0$ and $10^1$ are not displayed on the display device. Namely, these lowest digit position counters 15a and 15b perform functions of a frequency divider.

Let it be assumed that the power measuring circuit 11 generates pulses at the rate of 100 pulses for 1 kwh of power being measured. The pulses generated in this fashion are supplied to the lowest digit position counter 15a of the 6-digit decimal counter 15. Every time the lowest digit position counter 15a for the digit position of $10^0$ counts 10 pulses, a carry signal is supplied to the adjacent digit position counter 15b for the digit position of $10^1$. Likewise, a carry signal is supplied to the digit counter 15c for the digit position of $10^2$ every time the digit position counter 15b counts 10 pulses carried from the lowest digit position counter 15a. It follows that the frequency of the pulse generated by the power measuring circuit 11 is divided by the digit position counters 15a and 15b into one-hundredth and the frequency-divided pulse is counted by the digit position counter 15c for the digit position of $10^2$. Since the power measuring circuit 11 generates pulses at the rate of 100 pulses/kwh, the digit position counter 15c counts the unit of 1 kwh. Similarly, the digit position counters 15d, 15e and 15f count the units of 10 kwh, 100 kwh and 1,000 kwh, respectively. The contents of these digit position counters 15c to 15f are displayed through the BCD to 7-segment decoder 16 on the corresponding display units 17a to 17d f the display device 17, respectively.

As described in detail, the electronic watt-hour meter of this invention comprises an N-digit decimal counter formed of non-volatile semiconductor elements. Th pulses generated by the power measuring circuit 11 are supplied to the lowest digit position counter of the N-digit decimal counter and the n-number of lowest digit position counters (n<N) act as a frequency divider, with the contents of the digit counters higher than the n-th digit position counter being displayed on the display device. The watt-hour meter of this construction is advantageous in that the contents of the n-number of lowest digit position counters acting as a frequency divider are not erased even during a power failure. Accordingly, the calculation can be performed accurately all the time. In addition, the counter device is free from a mechanical abrasion inherent in a mechanical counter, resulting in a prolonged life of the watt-hour meter.

In the embodiment described, the counter device is formed of a 6-digit decimal counter, with the two lowest digit position counters acting as a frequency divider and the remaining four digit counters being connected to the display device. However, the counter device used in this invention need not be restricted to the one described. For example, it is satisfactory to use an 8-digit decimal counter, with the two lowest digit position counters acting as a frequency divider the digit position counters for the intermediate four digit positions being connected to a display device and the two highest digit position counters being unused. What should be noted is that the number of digits of the counter device can be chosen appropriately, as required.

In this invention, it is possible to substitute a dynamic display system as shown in FIG. 3 for the static display system used in the embodiment described. In FIG. 3, a counter device 18 is provided by a 6-digit decimal counter capable of performing a dynamic output function, namely, capable of producing a digit-designating output signal. As shown in the drawing, the output of the counter device 18 is supplied to the display device 17 through a decoder 19.

The embodiment of FIG. 2 uses only one N-digit decimal counter. But, it is possible to use an N-digit decimal counter device comprising cascade-connected two 4-digit decimal counters as shown in FIG. 4. In this case, a carry signal produced from the output terminal of a counter 15A is supplied to the input terminal of a counter 15B.

What is claimed is:

1. An electronic watt-hour meter, comprising:
 a power measuring the power to be measured and generating pulses proportional to the power;
 a counter device counting each of the pulses generated by the power measuring circuit without frequency division; and
 a display device visually displaying the contents of the counter device;
 the counter device being provided by an N-digit decimal counter having consecutive digit position counter sections and formed of non-volatile semiconductor elements, the pulses generated by the power measuring circuit being supplied to the lowest digit position counter section of the N-digit decimal counter, the n number of lowest digit position counter sections acting as a frequency divider and being disconnected from said display device to retain the lowest digits which are not displayed, and consecutive digit position counter sections including the counter section adjacent to the lowest digit position counter sections being connected to corresponding display units of the display device for visual display of the contents of said digit counter sections.

2. The electronic watt-hour meter according to claim 1, wherein the N-digit decimal counter is formed of a counter performing a static output function.

3. The electronic watt-hour meter according to claim 1, wherein the n-digit decimal counter is formed of a counter performing a dynamic output function.

4. The electronic watt-hour meter according to claim 1, wherein the N-digit decimal counter is formed of at least two individual counters cascade-connected to each other.

* * * * *